(12) United States Patent
Kang

(10) Patent No.: US 8,125,066 B1
(45) Date of Patent: Feb. 28, 2012

(54) PACKAGE ON PACKAGE CONFIGURATIONS WITH EMBEDDED SOLDER BALLS AND INTERPOSAL LAYER

(75) Inventor: Teck-Gyu Kang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/501,987

(22) Filed: Jul. 13, 2009

(51) Int. Cl.
*H01L 23/02* (2006.01)
*H01L 23/34* (2006.01)
*H01L 23/48* (2006.01)
*H01L 23/52* (2006.01)
*H01L 29/40* (2006.01)

(52) U.S. Cl. ........ 257/686; 257/685; 257/723; 257/738; 257/777; 257/E23.069; 257/E23.085; 257/E23.116

(58) Field of Classification Search .......... 257/685–686, 257/723, 738, 777, E23.069, E23.085, E23.116
See application file for complete search history.

(56) References Cited

U.S. PATENT DOCUMENTS

| | | | |
|---|---|---|---|
| RE35,733 E * | 2/1998 | Hernandez et al. | 361/734 |
| 6,507,098 B1 * | 1/2003 | Lo et al. | 257/686 |
| 6,828,665 B2 * | 12/2004 | Pu et al. | 257/686 |
| 7,166,494 B2 * | 1/2007 | Karnezos | 438/108 |
| 7,187,068 B2 * | 3/2007 | Suh et al. | 257/685 |
| 7,317,622 B2 * | 1/2008 | Li | 361/782 |
| 7,420,269 B2 * | 9/2008 | Ha et al. | 257/686 |
| 7,498,667 B2 * | 3/2009 | Ha et al. | 257/686 |
| 7,528,474 B2 * | 5/2009 | Lee | 257/686 |
| 7,580,269 B2 * | 8/2009 | Li | 361/782 |
| 7,687,905 B2 * | 3/2010 | Stone et al. | 257/724 |
| 7,709,944 B2 * | 5/2010 | Kuan et al. | 257/686 |
| 7,851,900 B2 * | 12/2010 | Ohsaka et al. | 257/686 |
| 7,871,861 B2 * | 1/2011 | Song et al. | 438/122 |
| 2006/0108676 A1 * | 5/2006 | Punzalan et al. | 257/686 |
| 2007/0007643 A1 * | 1/2007 | Oh et al. | 257/701 |
| 2007/0090508 A1 * | 4/2007 | Lin et al. | 257/686 |
| 2007/0210433 A1 * | 9/2007 | Subraya et al. | 257/686 |
| 2008/0054430 A1 * | 3/2008 | Coteus et al. | 257/686 |
| 2008/0111224 A1 * | 5/2008 | Byun et al. | 257/686 |
| 2008/0142961 A1 * | 6/2008 | Jones et al. | 257/724 |
| 2008/0227238 A1 * | 9/2008 | Ko et al. | 438/108 |
| 2009/0127688 A1 * | 5/2009 | Lee et al. | 257/686 |
| 2009/0236718 A1 * | 9/2009 | Yang et al. | 257/686 |
| 2009/0236720 A1 * | 9/2009 | Yoon et al. | 257/686 |
| 2009/0243065 A1 * | 10/2009 | Sugino et al. | 257/686 |
| 2009/0243070 A1 * | 10/2009 | Ko et al. | 257/686 |
| 2009/0321908 A1 * | 12/2009 | Song et al. | 257/686 |
| 2010/0019360 A1 * | 1/2010 | Khan et al. | 257/675 |
| 2010/0102327 A1 * | 4/2010 | Standing | 257/76 |
| 2010/0117192 A1 * | 5/2010 | Lee et al. | 257/532 |
| 2010/0244585 A1 * | 9/2010 | Tan et al. | 307/109 |

* cited by examiner

*Primary Examiner* — Ida M Soward
(74) *Attorney, Agent, or Firm* — Womble Carlyle Sandridge & Rice, LLP

(57) ABSTRACT

An integrated circuit (IC) package is disclosed. The IC package has an IC chip disposed on a top surface of a package substrate. Multiple solder balls are placed on the top surface of a package substrate, surrounding the IC chip. A molding compound covers the top surface area of the package substrate and surrounds the IC chip and each of the solder balls on the surface of the package substrate, leaving the top of each of the solder balls exposed. The embedded solder balls on the top surface of the package substrate may be used to connect the IC package to another IC package that may be placed directly on top of it. The solder balls may also be used to connect the IC package to another package substrate or an interposal substrate that may in turn be connected to another IC chip or package.

17 Claims, 5 Drawing Sheets

PACKAGE ON PACKAGE CONFIGURATIONS WITH EMBEDDED SOLDER BALLS AND INTERPOSAL LAYER

BACKGROUND

Package-on-Package (PoP) structures are integrated circuit (IC) package structures where two or more IC packages are stacked or placed on top of one another. Usually, these stacked IC packages would have interconnections that connect and route signals between them. Typical PoP configurations include two or more memory packages stacked on top of one another or a memory package stacked on top of a logic package. For instance, a logic package with a higher I/O (input/output) density may be placed at the bottom of the PoP structure, while a memory package with a lower I/O density may be placed on top of the logic package. Such a configuration is commonly used in a cell phone where the logic package could be an application processor for the cell phone.

However, conventional PoP structures may have a low assembly yield due to the low stacking yield during the stacking process. One of the common causes of the low yield in PoP assembly is 'solder ball shear'. Solder balls placed on the perimeter of the top surface of a package substrate are generally used to connect two or more packages together. However, when one IC package is mounted on another IC package, the solder balls may break or shear. This is mainly caused by warpage on the bottom IC package because the bond between the solder balls and the bottom IC package is not strong enough to hold the weight of the top IC package.

Apart from the low assembly yield, because the solder balls that connect the top and bottom packages are only placed on the perimeter area of the bottom package substrate, common ball grid array (BGA) packages cannot be mounted on top of a conventional PoP structure. Therefore, the top IC package may require a special ball layout in order to be mounted on the bottom IC package. This greatly limits the ball layout on the top package and also the number of packages that can be mounted.

As such, it is desirable to have a PoP structure that would not limit the types of IC packages that can be placed on top. It is also desirable to have a stronger and more stable structure that can accommodate the weight of one or more IC packages on top of another. It is within this context that the invention arises.

SUMMARY

Embodiments of the present invention include apparatuses and a method for creating a PoP package structure.

It should be appreciated that the present invention can be implemented in numerous ways, such as a process, an apparatus, a system, or a device. Several inventive embodiments of the present invention are described below.

In one embodiment, an IC package is disclosed. The IC package comprises an IC disposed on a package substrate. Solder balls are placed on the package substrate, surrounding the IC. A molding compound is injected onto the surface of the package substrate. The injected molding compound surrounds the IC and substantially covers the area of the top surface of the package substrate. The molding compound also surrounds and covers the solder balls on the package substrate, leaving the top surface of the solder balls exposed. The exposed top surface of the embedded solder balls provide interconnections between the IC package with another IC package that may be placed on top.

In another embodiment, an IC package is disclosed. The IC package comprises a first package substrate with solder balls disposed on a bottom surface of the first package and an IC disposed on a top surface of the first package substrate. A second package substrate is disposed on the top surface of the first IC package. The second package substrate is an interposal substrate with sides that extend from the bottom surface of the second package substrate and surround the IC on the first package substrate. The extended sides of the interposal substrate also define a cavity to accommodate the IC on the first package substrate. In one embodiment, the top surface of the second package substrate includes solder balls, or solder pads, to electronically connect the first IC package with one or more IC packages that may be placed on the interposal substrate.

In yet another embodiment in accordance with the present invention, a method of packaging an IC is disclosed. The method includes placing an IC onto a package substrate and disposing a plurality of solder balls onto the package substrate. The solder balls on the packaging substrate surround the IC on the package substrate. A molding compound is injected onto the package substrate such that the molding compound substantially covers the top surface of the package substrate and embeds the solder balls disposed on the package substrate. In one embodiment, the top surface of each of the solder balls is exposed and another IC package or an interposal substrate, placed on top of the bottom IC package, may be connectable to the bottom IC package through the solder balls.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe apparatuses and a method for creating a Package-on-Package (PoP) structure.

It will be obvious, however, to one skilled in the art, that the present invention may be practiced without some or all of these specific details. In other instances, well-known operations have not been described in detail in order not to unnecessarily obscure the present invention.

The embodiments described herein provide techniques to create PoP structures with less warpage. Some of these embodiments also allow a wider array of packages that can be used as a top package in PoP structures. One of the embodiments describes a PoP structure with embedded solder balls that can potentially lower package warpage and increase assembly yield. The solder balls that are used to support and connect the top IC package to the bottom IC package in a PoP structure are surrounded or embedded by molding compound. The molding compound provides a greater bonding strength between the solder balls and the package substrate to prevent package warpage, especially in the bottom package. Another embodiment describes a PoP structure that does not require the top IC package to have a specific ball layout in order to connect to the bottom IC package. This embodiment does not limit the size of the top IC package and the number of packages that can be mounted on the bottom package. These embodiments therefore provide better warpage control and higher flexibility in terms of package selection in a PoP structure.

Figure 1:
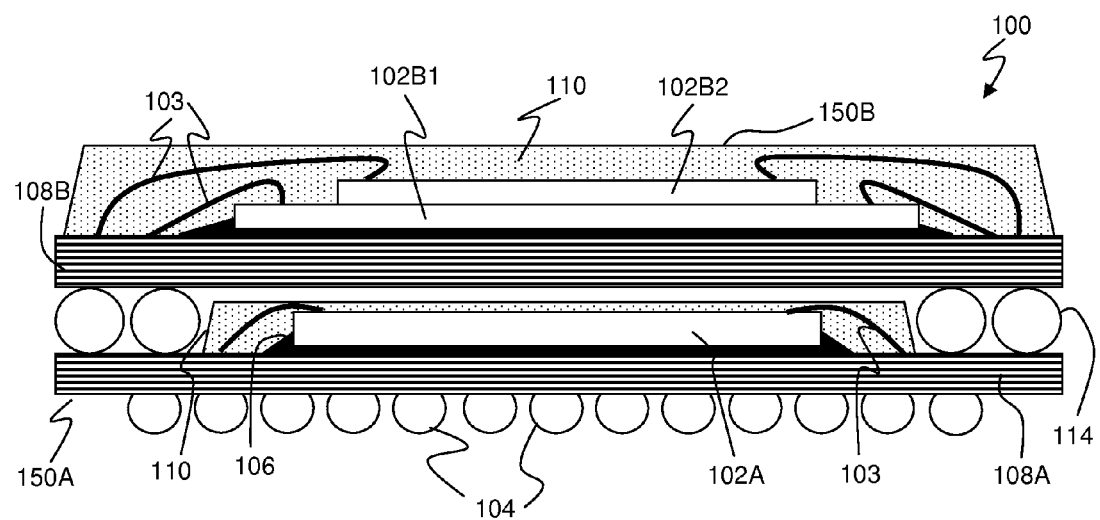
FIG. 1, meant to be exemplary and not limiting, shows a Package-on-Package (PoP) structure with two IC packages.

FIG. 1, meant to be exemplary and not limiting, shows a PoP structure 100 with two IC packages 150A and 150B. PoP structure 100 shown in FIG. 1 is a typical configuration used in handheld devices, e.g. cell phones, where a memory package with less I/O density, i.e., IC package 150B is placed on top of a logic package with a higher I/O density requirement, i.e., IC package 150A. IC package 150A is a wirebond IC package with IC 102A disposed on package substrate 108A. IC 102A is attached to package substrate 108A with adhesive 106. Adhesive 106 may be a conductive adhesive or solder in the form of paste. Wires 103 are attached to the top side of IC 102A and package substrate 108A. Wires 103 electrically connect IC 102A to package substrate 108A. Commonly used wires are either made of gold (Au), aluminum (Al) or copper (Cu). Molding compound 110 encapsulates IC 102A and wires 103 to protect IC 102A and all the other components from moisture and external elements. In one embodiment, molding compound 110 is made of epoxy resin. A plurality of contact leads or solder balls 104 is disposed on an opposing side of package substrate 108A. Signals from IC 102A are transmitted outside of IC package 150A by solder balls 104.

Referring still to FIG. 1, a second IC package, IC package 150B is placed on top of IC package 150A. In the illustrative example of FIG. 1, IC package 150B is another wirebond IC package with two IC chips, i.e., IC 102B1 and IC 102B2. Wires 103 connect ICs 102B1 and 102B2 to package substrate 108B of IC package 150B and molding compound 110 encapsulates ICs 102B1 and 102B2 of IC package 150B. Solder balls 114 connect IC package 150B to IC package 150A. Solder balls 114 need to be big enough to accommodate the height of molding compound 110 of IC package 150A. PoP structure 100 is also prone to package warpage because molding compound 110 in IC package 150A does not extend to the perimeter of IC package 150A and IC 150B is supported solely by solder balls 114 placed on substrate 108A of IC package 150A. As such, the bottom IC package, i.e., IC package 150A, may easily be warped during the stacking process. Because the interconnects between the two IC packages, i.e., solder balls 114, are positioned only on the perimeter of the bottom IC package, the top IC package 150B needs to be almost the same size as the bottom IC package 150A in order for both packages to be properly connected. Furthermore, IC package 150B may not be able to accommodate a high I/O requirement because the number of interconnects, i.e., solder balls 114, on IC package 150B is limited. It should be appreciated that even though wirebond IC packages 150A and 150B are shown in FIG. 1, another IC package, e.g., a flip chip IC package, can be used in place of both IC packages.

Figure 2A:
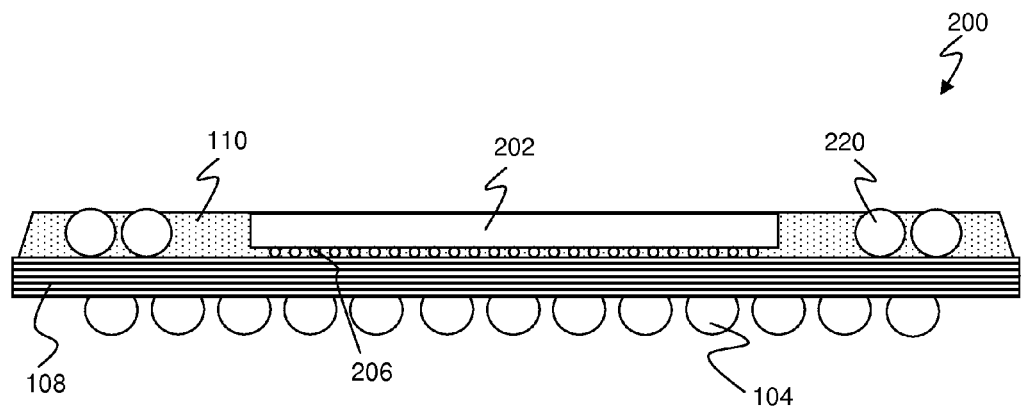
FIG. 2A, meant to be illustrative and not limiting, shows an IC package with embedded solder balls as an embodiment in accordance with the present invention.

FIG. 2A, meant to be illustrative and not limiting, shows IC package 200 with embedded solder balls 220 as an embodiment in accordance with the present invention. A flip chip IC package 200 is shown in FIG. 2A as an exemplary embodiment even though a wirebond package is also applicable in this context. IC 202 with solder bumps 206 is disposed on top of package substrate 108. The plurality of solder bumps 206 connects IC 202 to package substrate 108. Signals from IC 202 are transmitted outside of IC package 200 by solder balls 104 from solder bumps 206 through package substrate 108. Solder balls 220, placed on the top surface of package substrate 108, may be used to connect IC package 200 to another IC package that may be placed on top of IC package 200. Unlike solder balls 114 of FIG. 1, solder balls 220 are embedded into molding compound 110. Molding compound 110 extends to the perimeter of the top surface of package substrate 108 and substantially covers the top surface of package substrate. The top surface of solder balls 220 are exposed so that another IC package that may be placed on top of IC package 200 can be connectable to IC package 200 through solder balls 220. Therefore, solder balls 220 can be used to electronically connect either another IC package or an interposal substrate layer placed directly on top of IC package 200. Some of these configurations are shown and explained in detail in later paragraphs. The extended molding compound 110 provides support for solder balls 220 and reduces warpage in IC package 200 when one or more IC packages are placed on top of IC package 200.

Figure 2B:
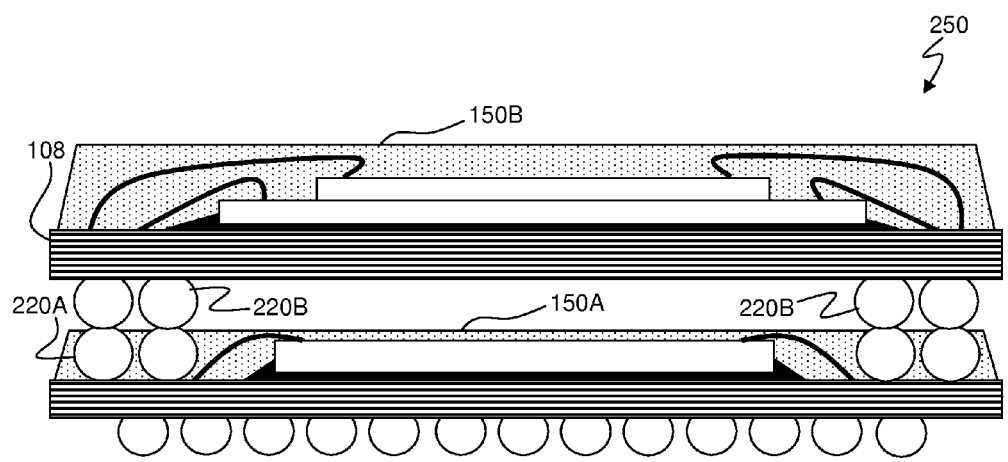
FIG. 2B, meant to be illustrative and not limiting, shows a PoP structure with embedded solder balls as an embodiment in accordance with the present invention.

FIG. 2B, meant to be illustrative and not limiting, shows PoP structure 250 with embedded solder balls 220A as an embodiment in accordance with the present invention. For the sake of brevity, components already shown in PoP structure 100 of FIG. 1 and described above are not repeated. PoP structure 250 is a structure with a wirebond IC package 150B placed on top of a wirebond IC package 150A with embedded solder balls 220A. Solder balls 220A are not fully embedded into molding compound 110 as the top surface of each of solder balls 220A is left exposed. Top package, IC package 150B, is electrically connected to IC package 150A through solder balls 220B and 220A. Solder balls 220B at the bottom of package substrate 108 of IC package 150B transmit signals from IC package 150B to IC package 150A through embedded solder balls 220A. Even though wirebond IC package 150B is shown as the top IC package in FIG. 2B, one skilled in the art should appreciate that other types of IC packages can be used as required.

Figure 2C:
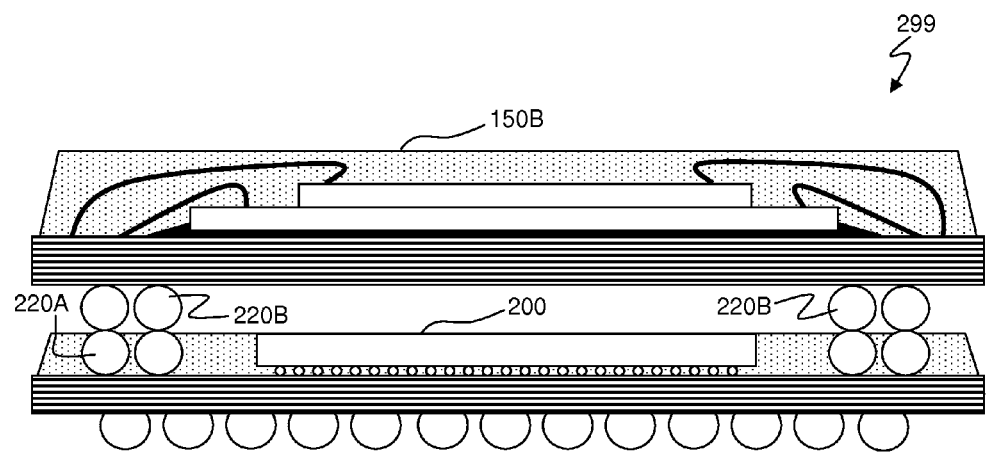
FIG. 2C, meant to be illustrative and not limiting, shows another PoP structure with embedded solder balls as another embodiment in accordance with the present invention.

FIG. 2C, meant to be illustrative and not limiting, shows another PoP structure 299 with embedded solder balls 220A as another embodiment in accordance with the present invention. PoP structure 299 shares many similarities with PoP structure 250 with the exception that a flip chip IC package 200 with embedded solder balls 220A is used as the bottom package instead of a wirebond IC package, e.g., IC package 150A as shown in FIG. 2B. Signals from the top IC package 150B are transmitted to the bottom IC package 200 through solder balls 220A and 220B. Even though only two IC packages are shown in the illustrative embodiments of FIGS. 2B and 2C, one skilled in the art will appreciate that more IC packages can be stacked as long as intermediate IC packages have embedded solder balls to form the necessary connections with the top package. It should also be appreciated that a thinner interconnection, e.g., solder pads, can be used in place of solder balls 220B shown in FIGS. 2B and 2C.

Figure 3A:
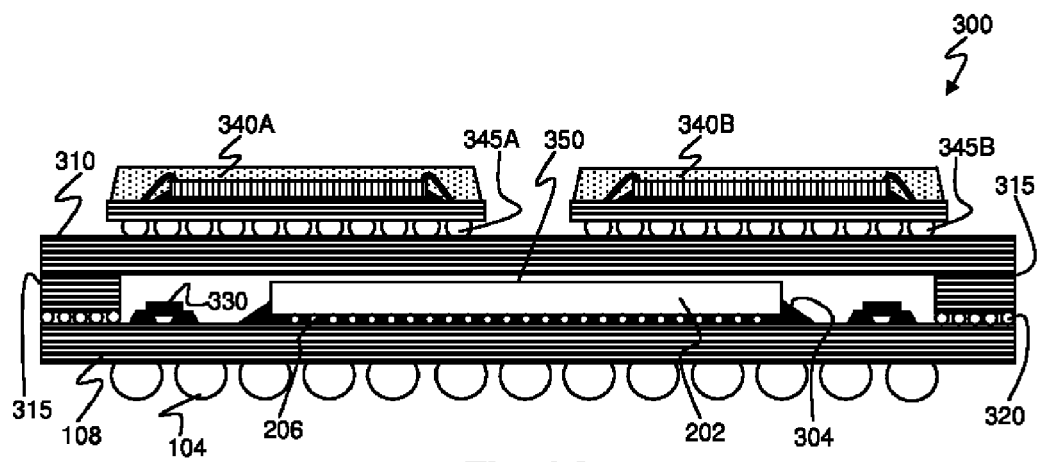
FIG. 3A, meant to be illustrative and not limiting, shows a PoP structure with an interposal substrate as yet another embodiment in accordance with the present invention.
Figure 3B:
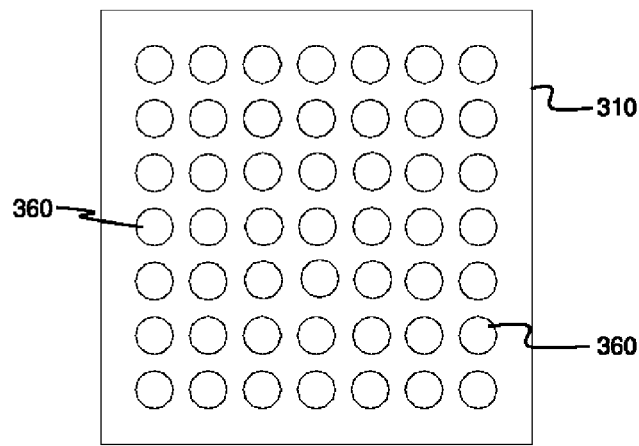
FIG. 3B, meant to be illustrative and not limiting, shows a top down view of an interposal substrate with arrays of solder pads as an embodiment in accordance with the present invention.

FIG. 3A, meant to be illustrative and not limiting, shows PoP structure 300 with interposal substrate 310 as yet another embodiment in accordance with the present invention. As an illustrative embodiment, the bottom IC package 350 is a flip chip IC package similar to IC package 200 of FIG. 2. But unlike IC package 200 of FIG. 2, IC package 350 does not have solder balls embedded in a molding compound. The cavity between IC 202, solder bumps 206 and package substrate 108 is filled with underfill 304. Underfill 304 is a sealing resin that is used to fill the gap and protect the solder joints between solder bumps 206 and package substrate 108. Substrate 310 is an interposal substrate that is placed on top of package substrate 108. Substrate 310 has side extensions 315 that extend from the bottom surface of the interposal substrate that surround and form a cavity around IC 202 when interposal substrate 310 is placed on package substrate 108. The space, or cavity, left unoccupied by the molding compound can be used to accommodate either a bigger die 202 or chip capacitors 330. The top surface of substrate 310 has arrays of solder pads. FIG. 3B shows a top down view of substrate 310 with arrays of solder pads 360 as an illustrative embodiment. IC packages 340A and 340B in PoP structure 300 of FIG. 3A are connected to IC package 350 through solder balls 345A and 345B, respectively, and solder pads 360 on the top surface of substrate 310.

Referring still to FIG. 3A, solder balls 320 on the bottom of substrate 310 electrically couple IC packages 340A and 340B that are placed on top of substrate 310 to IC package 350. In one embodiment, solder balls 320 are smaller in size compared to solder balls 104 on the bottom of package substrate 108. The smaller solder balls 320 can be used to accommodate a finer ball pitch and a higher number of I/Os (inputs/outputs). Even though only two IC packages, 340A and 340B, are shown in the embodiment of FIG. 3A, one skilled in the art will appreciate that more or fewer IC packages can be placed on top of substrate 310. It should also be appreciated that even though IC packages 340A and 340B are wirebond packages that are substantially similar in size, other types of IC packages, e.g., flip chip, and IC of varying sizes are also applicable in this context. As shown in FIG. 3B, the array of solder pads 360 on the top surface of substrate 310 can accommodate a wide variety of top IC packages. IC packages with different solder ball layouts can placed on top of substrate 310. Array of solder pads 360 can also accommodate IC package of different sizes to be placed on top of substrate 310. Substrate 310 with solder pads 360 can also support top IC packages with a relatively high number of I/Os because the interconnections between top and bottom IC packages are not limited to the perimeter of the bottom package substrate, unlike PoP structure 100 of FIG. 1 where the top and bottom IC packages are connectable through the solder balls 114 on the perimeter of package substrate 108A. The full area array of solder pads 360 on interposal substrate 310 provides more interconnections between the top and bottom IC packages compared to solder balls 114 of FIG. 1.

Figure 4:
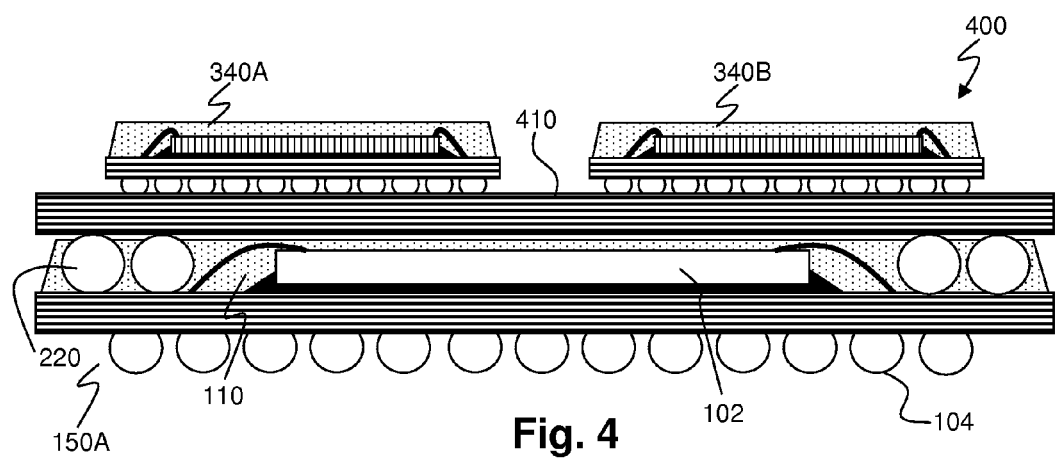
FIG. 4, meant to be illustrative and not limiting, shows a PoP structure with embedded solder balls and an interposal substrate as an embodiment in accordance with the present invention.

FIG. 4, meant to be illustrative and not limiting, shows PoP structure 400 with embedded solder balls 220 and interposal substrate 410 as an embodiment in accordance with the present invention. IC package 150A in FIG. 4 is similar to that shown in FIG. 2B and as such, components already described above are not repeated. IC 102 and solder balls 220 are embedded into molding compound 110. The top surface of solder balls 220 are exposed and interposal substrate 410, placed on top of IC package 150A, rests directly on solder balls 220. The top surface of interposal substrate 410 is filled with solder pads to electrically couple IC packages 340A and 340B to IC package 150A. In one embodiment, the top surface of interposal substrate 410 has arrays of solder pads similar to solder pads 360 shown in the illustrative embodiment of FIG. 3B. The embodiment of FIG. 4 may be suitable for low power and small die applications that generate less heat because die or IC 102 is embedded into molding compound 110 and there is relatively little space between interposal substrate 410 and IC package 150A.

Figure 5:
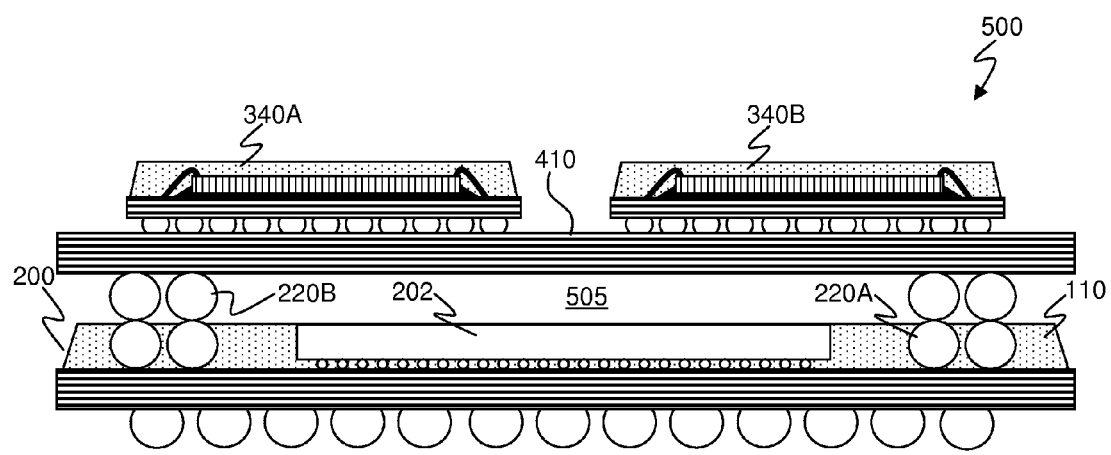
FIG. 5, meant to be illustrative and not limiting, shows a PoP structure as another embodiment in accordance with the present invention.

FIG. 5, meant to be illustrative and not limiting, shows PoP structure 500 as another embodiment in accordance with the present invention. IC package 200 in FIG. 5 is similar to that shown in FIG. 2A. Therefore, for the sake of brevity, components already described and shown in FIG. 2A are not repeated. IC packages 340A and 340B are electronically connected to IC package 200 through interposal substrate 410. The back of flip chip die 202 may be exposed and left uncovered by molding compound 110 similar to the top surface of solder balls 220A. Solder balls 220B, placed on the top surface of embedded solder balls 220A, are used to connect interposal substrate 410 to IC package 200. The space 505 between interposal substrate 410 and IC package 200, separated by solder balls 220B, may be left empty or filled with a heat sink to improve heat dissipation for IC package 200. As such, the embodiment of FIG. 5 may be suitable for high power device that requires a larger die and greater heat dissipation.

Figure 6:
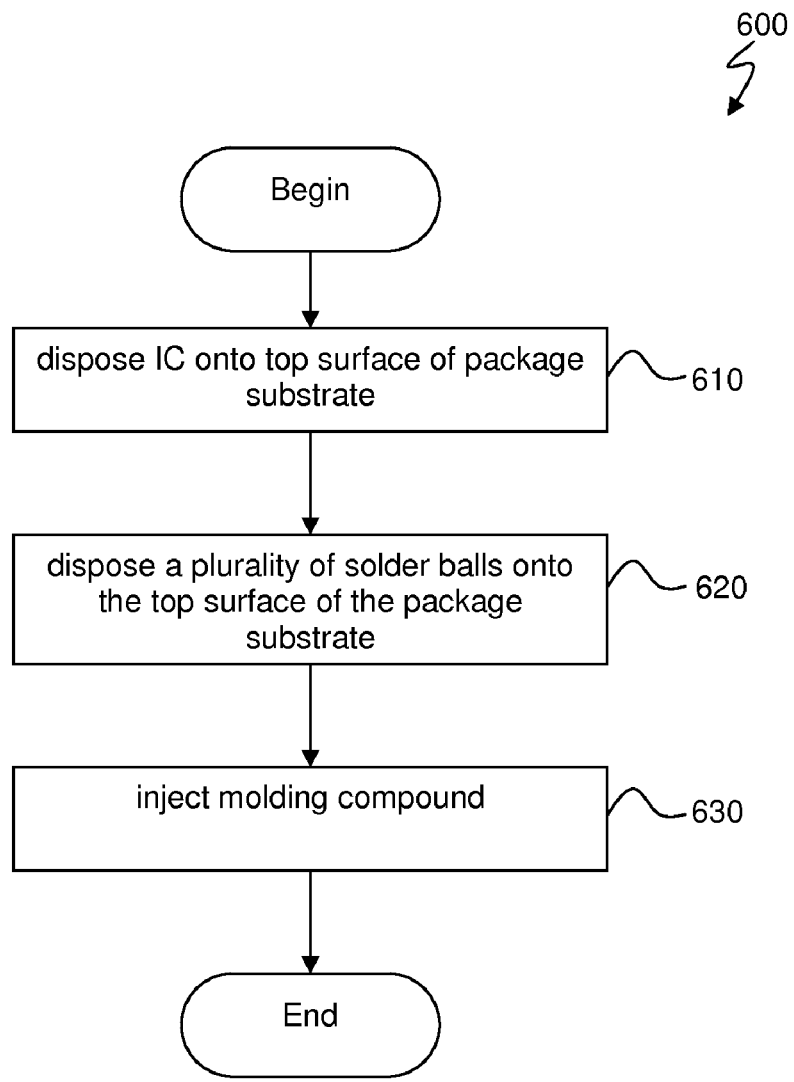
FIG. 6, meant to be illustrative and not limiting, shows a simplified method flow for packaging an IC in accordance with one embodiment of the present invention.

FIG. 6, meant to be illustrative and not limiting, shows simplified method flow 600 for packaging an IC in accordance with one embodiment of the present invention. One skilled in the art will know that other well-known steps, such as substrate preparation, IC attachment, underfilling, wire bonding, molding and curing, etc., in the IC packaging process have been left out so as not to obscure the present invention. An IC is disposed into the top surface of a package substrate in operation 610. A plurality of solder balls is disposed onto the top surface of the package substrate in operation 620, surrounding the IC on the package substrate. A molding compound is injected into the IC package in operation 630. The injected mold compound will surround the IC and each of the solder balls on the package substrate. In the illustrative embodiment of FIG. 2A, molding compound 110 substantially covers the top surface of package substrate 108 and surrounds solder balls 220 and IC 202. In the illustrative embodiment of FIG. 2A, solder balls 220 are not fully embedded into molding compound 110 as the top portion of each solder ball 220 is left exposed. A second IC package may be disposed on top of the packaged IC, as shown in the embodiments of FIGS. 2B and 2C. The substantially embedded solder balls on the top surface of the package substrate electronically connect the packaged IC to the second IC that is placed on top. In one embodiment, another package substrate may be disposed on top of the packaged IC. The package substrate may be an interposal substrate with contact pads on its top surface for the placement of one or more IC packages as that shown in the illustrative embodiments of FIG. 4 and FIG. 5.

Having embedded solder balls in PoP structures reduces warpage in the structures and increases assembly yield. The bottom IC package is more stable during stacking when the molding compound is extended to the sides of the package substrate. Without the molding compound to embed the solder balls on the top of the package substrate, the bottom IC package is prone to warpage as the bottom IC package can easily be warped during the stacking process when the bottom package is subjected to more weight. For applications with high I/O requirements, an interposal substrate with arrays of contact pads provides the necessary interconnections between the top and bottom IC packages without restricting the type of packages that can be used. In other words, the top IC package does not need to have a specific solder ball layout in order to be properly connected to the bottom IC package. A PoP structure with an interposal substrate can therefore accommodate a wider selection of top packages and a higher I/O requirement compared to a conventional PoP structure.

One skilled in the art will appreciate that specific wire-bond and flip chip packages with a ball grid array is provided in the exemplary illustrations of FIGS. 1-5. However, this is not meant to be limiting as the techniques described herein may be applied to other packaging configurations, e.g., heat spreader ball grid array (HSBGA), low profile ball grid array (LBGA), thin fine pitch ball grid array (TFBGA), flip chip chip-scale package (FCCSP), etc.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit (IC) package comprising:
   a first IC package comprising:
      a first package substrate;
      a first IC disposed on a top surface of the first package substrate;
      a plurality of solder balls disposed on the top surface of the first package substrate, wherein the plurality of solder balls surrounds the first IC, and wherein a top surface of each solder ball of the plurality of solder balls is exposed; and
      a molding compound covering the top surface of the first package substrate, wherein the molding compound substantially surrounds the first IC and the plurality of solder balls;
   a second package substrate disposed over the first IC package, the second package substrate having a plurality of contact pads disposed on a top surface of the second package substrate and wherein the second package substrate is electrically coupled with the first IC package through the exposed top surface of the plurality of solder balls, wherein the second package substrate includes a side extension extending outward along an outer periphery of the second package substrate, and wherein a plurality of decoupling capacitors disposed on the top surface of the first package substrate is disposed between an inner side surface of the side extension and an outer edge of the first IC; and
   a second IC package disposed on the top surface of the second package substrate.

2. The IC package of claim 1, wherein the second IC package is a different package type from the first IC package and wherein the first IC package is a flip chip package.

3. The IC package of claim 1, wherein the second IC package is substantially similar to the first IC package.

4. The IC package of claim 1, wherein the second package substrate has a plurality of solder balls disposed at a bottom surface, wherein the plurality of solder balls at the bottom surface of the second package in contact with the plurality of solder balls on the top surface of the first package substrate.

5. The IC package of claim 1, wherein the first IC package and the second IC package are of varying sizes.

6. The IC package of claim 1, wherein the second IC package is electrically coupled to the second package substrate through the plurality of contact pads disposed on the top surface of the second package substrate.

7. The IC package of claim 6, wherein the second package substrate has a plurality of contacts pads disposed at a bottom surface of the second package substrate, the plurality of contact pads at the bottom surface of the second package substrate contacting the exposed top surface of the plurality of solder balls.

8. The IC package of claim 1, wherein a third IC package is disposed on the top surface of the second package substrate.

9. The IC package of claim 8, wherein a type of package for the second IC package is a same type as a type of package for the third IC package.

10. An integrated circuit (IC) package, comprising:
    a first IC package, the first IC package comprising;
       a first package substrate having a plurality of solder balls disposed on a bottom surface;
       a first IC disposed on a top surface of the first package substrate;
    a second package substrate disposed on the top surface of the first package substrate, wherein a bottom surface of the second package substrate has side extensions extending from the bottom surface, the side extensions surrounding the first IC on the first package substrate, wherein a plurality of decoupling capacitors disposed on the top surface of the first package substrate is disposed between an inner side surface of the side extension and an outer edge of the first IC; and
    a second IC package disposed on a top surface of the second package substrate.

11. The IC package of claim 10, wherein the side extensions comprise additional repeated layers of the second package substrate.

12. The IC package of claim 10, further comprising:
a third IC package disposed on the top surface of the second package substrate.

13. The IC package of claim 10, further comprising:
a plurality of contact pads disposed on a top surface of the second package substrate.

14. The IC package of claim 13 wherein the second IC package is electrically coupled to the first IC package through the contact pads.

15. The IC package of claim 13, wherein the second IC package comprises:
a third package substrate having a plurality of solder balls disposed on a bottom surface; and
a second IC disposed on a top surface of the third package substrate.

16. The IC package of claim 10, further comprising:
a plurality of solder balls disposed on a bottom surface of the side extensions of the second package substrate, wherein the plurality solder balls disposed on the bottom surface of the side extensions are in direct contact with the top surface of the first package substrate.

17. The IC package of claim 16, wherein the plurality of solder balls on the bottom surface of the side extensions of the second package substrate is smaller in size as compared to the plurality of solder balls on the bottom surface of the first package substrate.

* * * * *